(12) United States Patent
Otto et al.

(10) Patent No.: US 11,557,700 B2
(45) Date of Patent: Jan. 17, 2023

(54) METHOD OF PRODUCING OPTOELECTRONIC SEMICONDUCTOR COMPONENTS AND AN OPTOELECTRONIC SEMICONDUCTOR COMPONENT

(71) Applicant: OSRAM OLED GmbH, Regensburg (DE)

(72) Inventors: Isabel Otto, Regenstauf (DE); Alexander F. Pfeuffer, Regensburg (DE); Britta Göötz, Regensburg (DE); Norwin von Malm, Nittendorf (DE)

(73) Assignee: OSRAM OLED GmbH, Regensburg (DE)

( * ) Notice: Subject to any disclaimer, the term of this patent is extended or adjusted under 35 U.S.C. 154(b) by 32 days.

(21) Appl. No.: 17/206,336

(22) Filed: Mar. 19, 2021

(65) Prior Publication Data

US 2021/0210661 A1 Jul. 8, 2021

Related U.S. Application Data

(63) Continuation of application No. 16/335,632, filed as application No. PCT/EP2017/077326 on Oct. 25, 2017, now Pat. No. 11,018,283.

(30) Foreign Application Priority Data

Oct. 25, 2016 (DE) ..................... 10 2016 220 915.9

(51) Int. Cl.
*H01L 33/50* (2010.01)
*H01L 27/15* (2006.01)

(52) U.S. Cl.
CPC .......... *H01L 33/508* (2013.01); *H01L 27/153* (2013.01); *H01L 27/156* (2013.01);
(Continued)

(58) Field of Classification Search
CPC ..... H01L 27/153; H01L 27/156; H01L 33/50; H01L 33/504; H01L 33/507; H01L 33/508; H01L 2933/0041
(Continued)

(56) References Cited

U.S. PATENT DOCUMENTS 6,366,018 B1  4/2002  Garbuzov et al.
9,917,077 B2  3/2018  von Malm et al.
(Continued)

FOREIGN PATENT DOCUMENTS

CN       1868240 B  *  6/2010  ........... H01L 27/153
DE  10 2011 056 888 A1     6/2013
(Continued)

OTHER PUBLICATIONS

The Notification of Reason for Refusal dated Oct. 29, 2021, of counterpart Korean Application No. 10-2021-7003459, with an English translation.
(Continued)

*Primary Examiner* — Matthew E Warren
(74) *Attorney, Agent, or Firm* — DLA Piper LLP (US)

(57) ABSTRACT

An optoelectronic semiconductor component includes a primary light source including a carrier and a semiconductor layer sequence mounted thereon and configured to generate primary light, and at least one conversion unit of at least one semiconductor material adapted to convert the primary light into at least one secondary light, wherein the semiconductor layer sequence and the converter unit are separate elements, the semiconductor layer sequence includes a plurality of pixels, the pixels are configured to be controlled electrically independently of each other, the carrier includes a plurality of control units configured to drive the pixels, all pixels of a first group are free of a conversion unit and are configured to emit the primary light, all pixels of a second group of
(Continued)

pixels include exactly one conversion unit each and are configured to emit the at least one secondary light.

14 Claims, 9 Drawing Sheets

(52) U.S. Cl.
CPC ............ *H01L 33/50* (2013.01); *H01L 33/504* (2013.01); *H01L 33/507* (2013.01); *H01L 2933/0041* (2013.01)

(58) Field of Classification Search
USPC .............................................. 257/88, 89, 98
See application file for complete search history.

(56) References Cited

U.S. PATENT DOCUMENTS

| | | | |
|---|---|---|---|
| 10,008,487 B2 | 6/2018 | Otto et al. | |
| 10,026,868 B2 | 7/2018 | Otto et al. | |
| 2011/0256648 A1 | 10/2011 | Kelley et al. | |
| 2011/0260601 A1 | 10/2011 | Leatherdale et al. | |
| 2012/0037885 A1 | 2/2012 | Schardt et al. | |
| 2012/0097921 A1 | 4/2012 | Smith et al. | |
| 2014/0347538 A1 | 11/2014 | Toda | |
| 2015/0014716 A1 | 1/2015 | von Malm | |
| 2015/0256648 A1 | 9/2015 | Michaud et al. | |
| 2015/0279902 A1 | 10/2015 | von Malm et al. | |
| 2016/0190110 A1 | 6/2016 | Göötz et al. | |
| 2017/0062661 A1 | 3/2017 | Otto | |
| 2017/0080429 A1 | 3/2017 | Liebsch | |
| 2018/0102350 A1 | 4/2018 | Kim et al. | |
| 2019/0206851 A1* | 7/2019 | Takeya ................... | H05B 33/12 |

FOREIGN PATENT DOCUMENTS

| | | | | |
|---|---|---|---|---|
| DE | 10 2012 109 460 A1 | 4/2014 | | |
| DE | 10 2013 109031 A1 | 2/2015 | | |
| DE | 10 2014 101 896 A1 | 8/2015 | | |
| DE | 10 2014 105 999 A1 | 10/2015 | | |
| DE | 10 2014 112 750 A1 | 3/2016 | | |
| JP | 2002-217454 A | 8/2002 | | |
| JP | 2002-528890 A | 9/2002 | | |
| JP | 2008-262993 A | 10/2008 | | |
| JP | 2009-267164 A | 11/2009 | | |
| JP | 2010-525555 A | 7/2010 | | |
| JP | 2012-514329 A | 6/2012 | | |
| JP | 2012-532454 A | 12/2012 | | |
| JP | 2013-539229 A | 10/2013 | | |
| JP | 2015-528213 A | 9/2015 | | |
| KR | 10-2010-0114740 A | 10/2010 | | |
| WO | 2008/109296 A1 | 9/2008 | | |
| WO | WO-2010075177 A2 * | 7/2010 | ............ | H01L 33/08 |
| WO | 2012/042452 A2 | 4/2012 | | |
| WO | WO-2012090786 A1 * | 7/2012 | ........... | H01L 27/322 |
| WO | 2014/139849 A1 | 9/2014 | | |
| WO | 2015/139849 A1 | 9/2015 | | |

OTHER PUBLICATIONS

Notice of Reasons for Refusal dated Mar. 8, 2021, of counterpart Japanese Application No. 2019-521459, along with an English translation.

The Notification of Reasons for Refusal dated Aug. 16, 2021, of counterpart Japanese Application No. 2019-521459, along with an English translation.

The Decision to Grant a Patent dated Nov. 29, 2021, of counterpart Japanese Application No. 2019-521459, along with an English translation.

A. Carlson et al., "Transfer Printing Techniques for Materials Assembly and Micro/Nanodevice Fabrication," Advanced Materials, vol. 24, 2012, pp. 5284-5318, 2012 Wiley-VCH Verlag GmbH & Co KGaA, Weinheim.

Z.J. Liu et al., "A Novel BLU-Free Full-Color LED Projector Using LED on Silicon Micro-Displays," IEEE Photonics, Technology Letters, vol. 25, No. 23, Dec. 1, 2013, pp. 2267-2270.

H.S. El-Ghoroury et al., "Quantum Photonic Imager (QPI): A New Display Technology and Its Applications," ITE and SID, 2014, pp. 1292-1295.

Notification of Reason for Refusal dated Feb. 13, 2020 of counterpart Korean Application No. 10-2019-7010680 with English translation.

Notification of Reason for Refusal dated May 7, 2020 of counterpart Japanese Application No. 2019-521459 with English translation.

Notice of Final Rejection dated Sep. 10, 2020 of counterpart Korean Application No. 10-2019-7010680 with English translation.

Notice of Final Rejection dated Jan. 1, 2021 of counterpart Korean Application No. 10-2019-7010680 with English translation.

Office Action dated Mar. 2, 2021 of counterpart Korean Application No. 10-2021-7003459 with English translation.

The Notice of Final Rejection dated Sep. 17, 2021, of counterpart Korean Application No. 10-2021-7003459, along with an English translation.

* cited by examiner

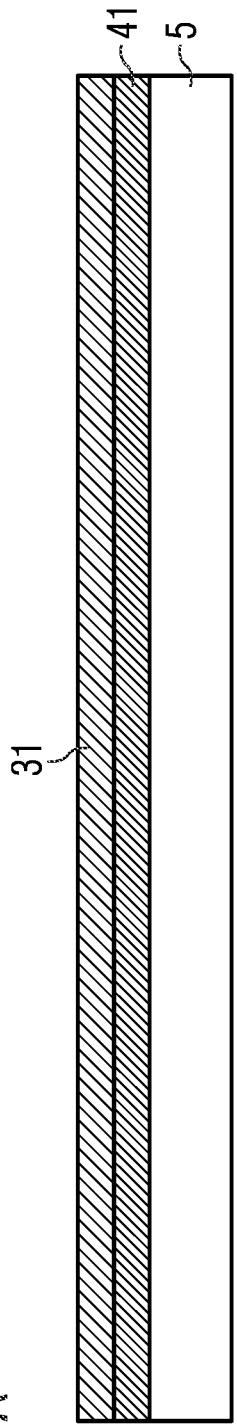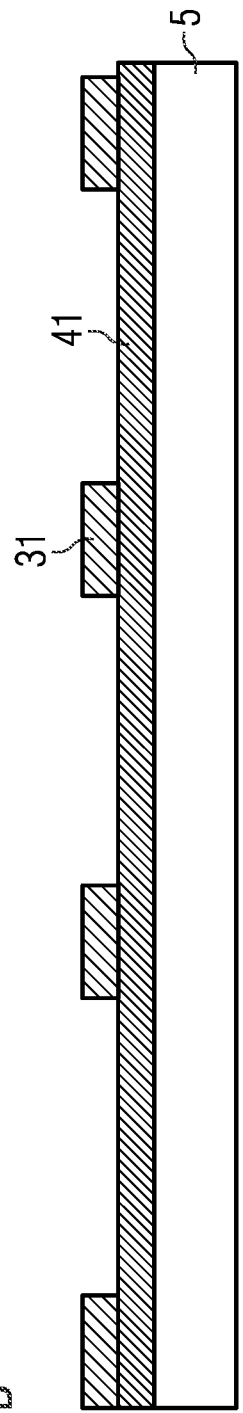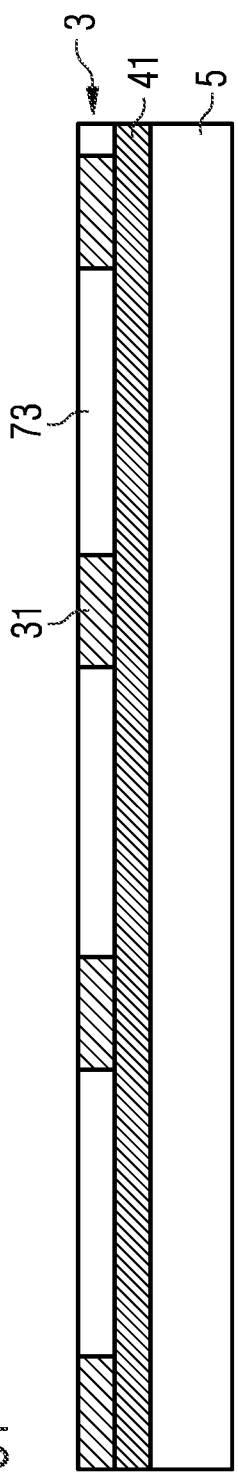

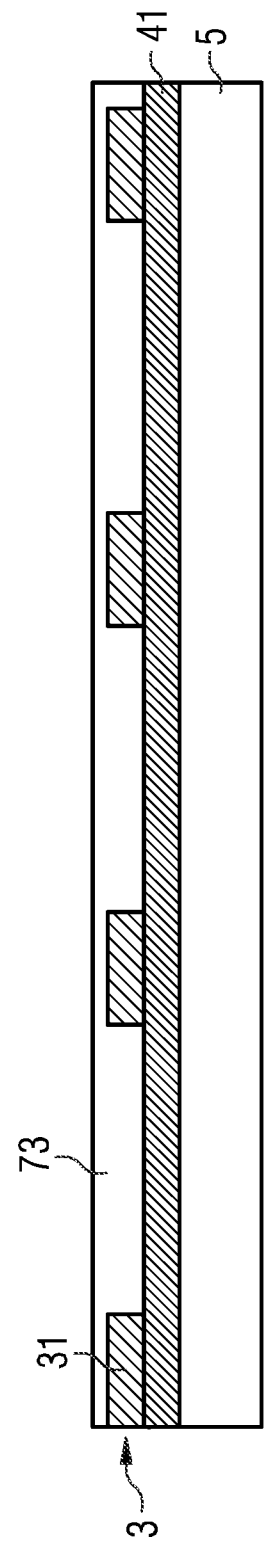
FIG 1C2
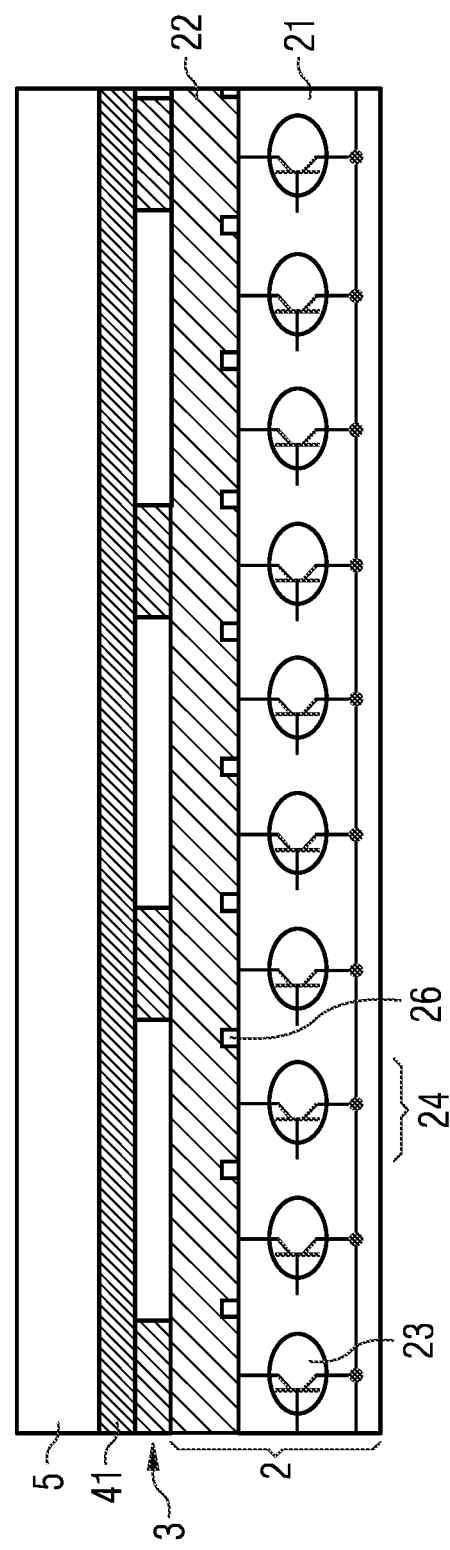
FIG 1D

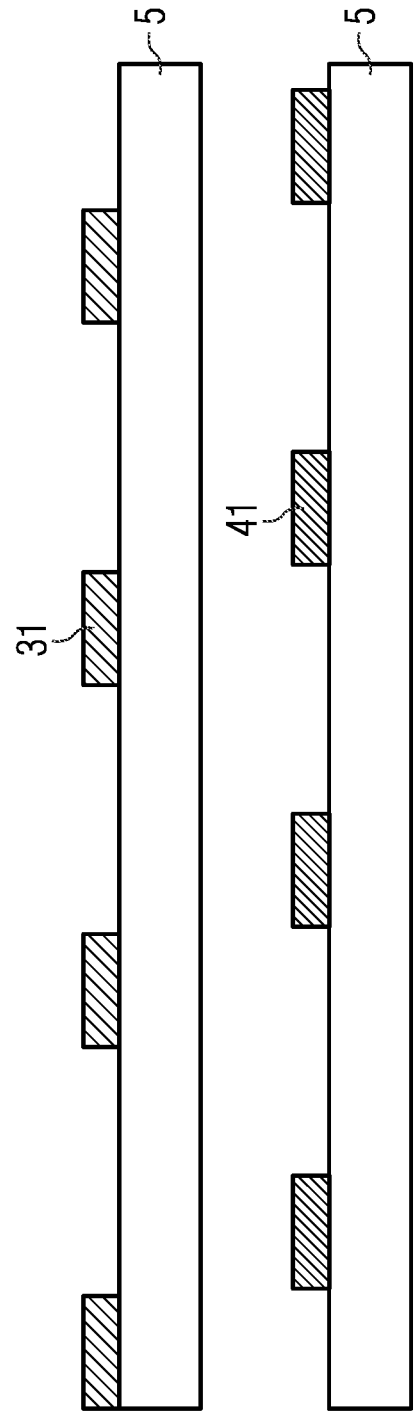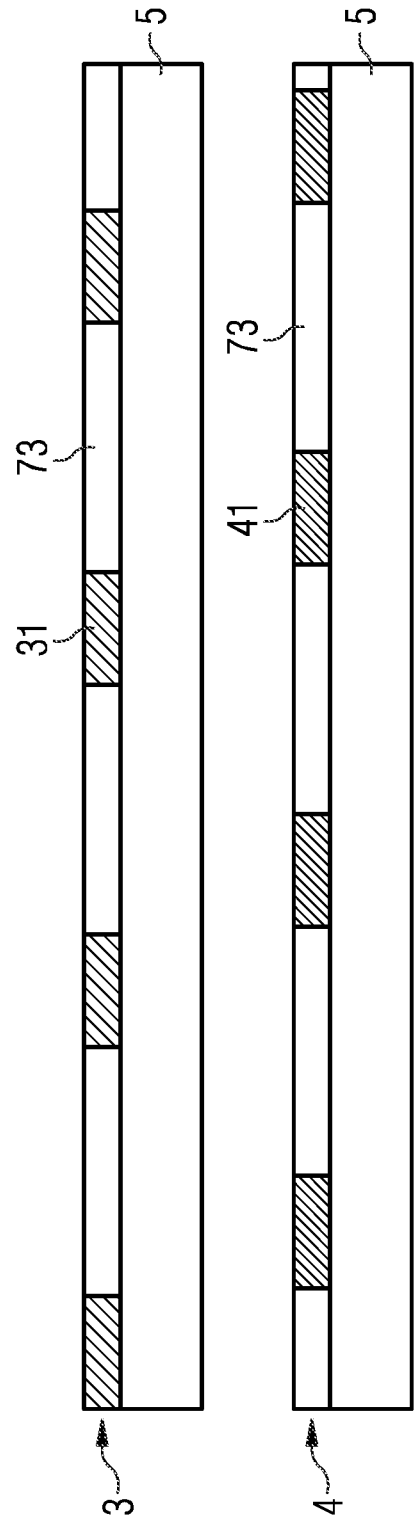

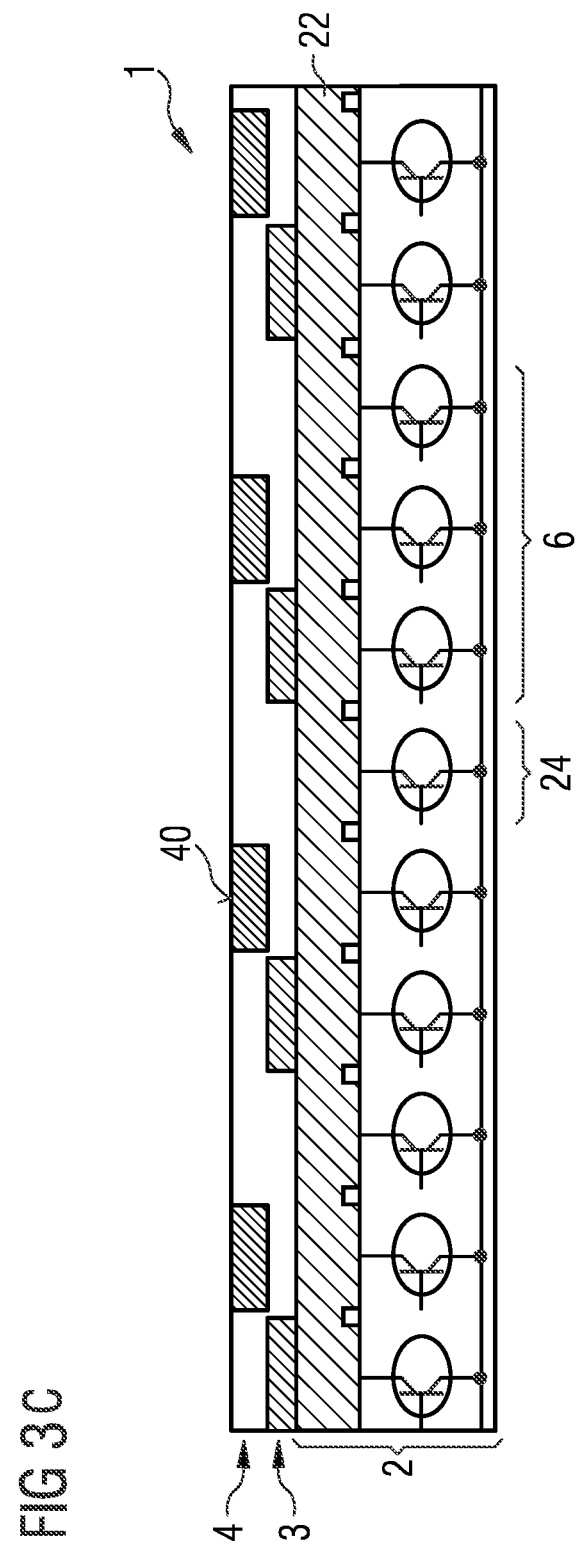

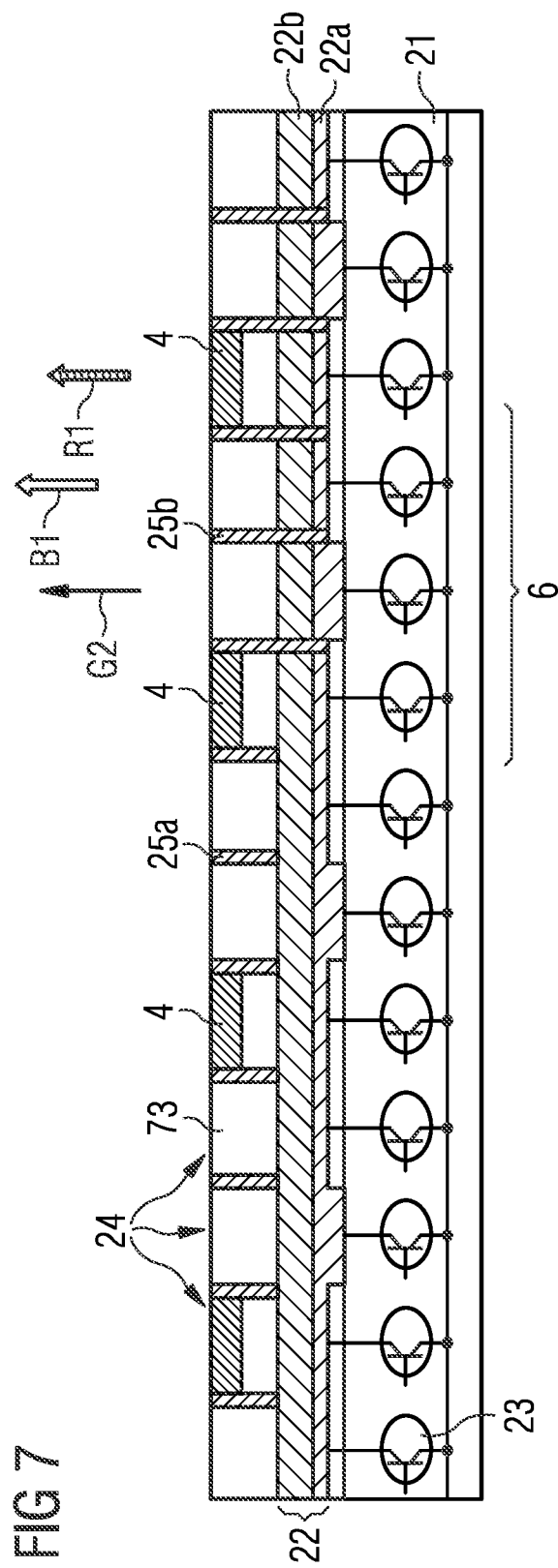

METHOD OF PRODUCING OPTOELECTRONIC SEMICONDUCTOR COMPONENTS AND AN OPTOELECTRONIC SEMICONDUCTOR COMPONENT

TECHNICAL FIELD

This disclosure relates to a method of producing optoelectronic semiconductor component and an optoelectronic semiconductor component.

BACKGROUND

There is a need to provide an optoelectronic semiconductor component with many pixels, that is adjustable to emit light in different colors, and can be produced efficiently.

SUMMARY

We provide a method of producing optoelectronic semiconductor components including providing a primary light source having a carrier and a semiconductor layer sequence mounted thereon that generates primary light (B), wherein the semiconductor layer sequence is structured into a plurality of pixels that can be driven electrically independently of each other, and the carrier includes a plurality of control units that drive the pixels, providing at least one conversion unit adapted to convert the primary light (B) into at least one secondary light (G,R), wherein the conversion unit is grown continuously from at least one semiconductor material, structuring the conversion unit, wherein portions of the semiconductor material are removed in accordance with the pixels, and applying the conversion unit to the semiconductor layer sequence so that the remaining semiconductor material is uniquely assigned to a portion of the pixels.

We also provide an optoelectronic semiconductor component including a primary light source including a carrier and a semiconductor layer sequence mounted thereon that generate primary light (B), and at least one conversion unit of at least one semiconductor material adapted to convert the primary light (B) into at least one secondary light (G,R), wherein the semiconductor layer sequence and the conversion unit are produced separately from each other and are not grown together, the semiconductor layer sequence is structured into a plurality of pixels that can be controlled electrically independently of each other, the carrier includes a plurality of control units that drives the pixels, no conversion unit is assigned to some of the pixels so that selected pixels emit the primary light (B), and exactly one conversion unit each is assigned to remaining pixels, a plurality of pixels emitting different colors are combined to form a display area that is adjustable to emit light of different colors, and a light path between the carrier and a light-exit side of the conversion unit facing away from the carrier is free of organic materials.

We further provide an optoelectronic semiconductor component including a primary light source including a carrier and a semiconductor layer sequence mounted thereon and configured to generate primary light, and at least one conversion unit of at least one semiconductor material adapted to convert the primary light into at least one secondary light, wherein the semiconductor layer sequence and the converter unit are separate elements, the semiconductor layer sequence includes a plurality of pixels, the pixels are configured to be controlled electrically independently of each other, the carrier includes a plurality of control units configured to drive the pixels, all pixels of a first group are free of a conversion unit, and the pixels of the first group are configured to emit the primary light, all pixels of a second group of pixels include exactly one conversion unit each, and the pixels of the second group are configured to emit the at least one secondary light, a plurality of pixels from the first group and the second group are combined to form a display area that is adjustable to emit light of different colors, and a light path between the carrier and a light-exit side of the conversion unit facing away from the carrier is free of organic materials.

We further yet provide an optoelectronic component including a primary light source including a carrier and a semiconductor layer sequence mounted thereon that generate primary light, and at least one conversion unit of at least one semiconductor material adapted to convert the primary light into at least one secondary light, wherein the semiconductor layer sequence and the conversion unit are produced separately from each other and are not grown together, the semiconductor layer sequence is structured into a plurality of pixels that can be controlled electrically independently of each other, the carrier includes a plurality of control units that drive the pixels, no conversion unit is assigned to some of the pixels so that selected pixels emit the primary light, and exactly one conversion unit each is assigned to remaining pixels, a plurality of pixels emitting different colors are combined to form a display area that is adjustable to emit light of different colors, and a light path between the carrier and a light-exit side of the conversion unit facing away from the carrier is free of organic materials.

BRIEF DESCRIPTION OF THE DRAWINGS

FIGS. 1A-1F, 2A-2B, 3A-3C, and 6A-6B are schematic sectional representations of process steps of examples of methods described for the production of optoelectronic semiconductor components.

FIGS. 4, 5 and 7 are schematic sectional views of examples of optoelectronic semiconductor components.

REFERENCE CHARACTER LIST

Figure 1E:
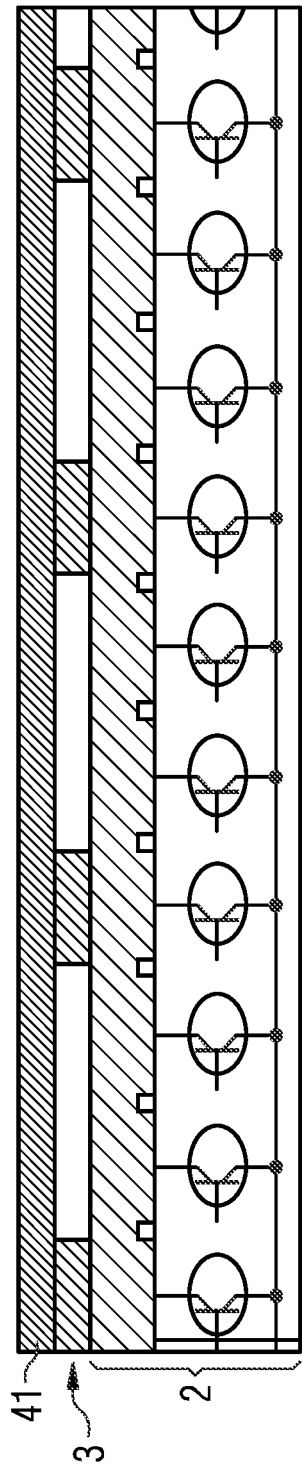

1 optoelectronic semiconductor component
2 primary light source
21 carrier
22 semiconductor layer sequence
22a first semiconductor layer sequence
22b second semiconductor layer sequence
23 control unit
24 pixels
25 opaque partition wall
26 separation region
27 raw material layer
3 first conversion unit
31 semiconductor material
4 second conversion unit
40 light-exit side
41 semiconductor material
5 growth substrate
6 display area (pixels)
71 mirror layer
72 filter layer
73 planarization layer
B primary light
B1 first primary light
G first secondary light G2 second primary light
R second secondary light
R1 secondary light

DETAILED DESCRIPTION

Our method produces optoelectronic semiconductor components. Several of the semiconductor components can be produced together in a wafer composite. The optoelectronic semiconductor components are adapted to generate color-adjustable light. The produced semiconductor components serve, for example, as display devices, as displays or in spotlights with adjustable emission characteristics, for example, in motor vehicles.

The method may comprise the step of providing a primary light source. The primary light source generates electromagnetic radiation, especially primary light, via electroluminescence. Primary light is preferably blue light, for example, with a wavelength of maximum intensity of at least 420 nm or 435 nm and/or at most 480 nm or 460 nm.

The primary light source may alternatively or additionally generate electromagnetic radiation in other wavelength ranges. For example, the primary light source may produce ultraviolet radiation alternatively or in addition to blue light, for example, with a wavelength of maximum intensity at 365 nm minimum and/or 420 nm maximum. For example, the primary light source may produce green light alternatively or in addition to blue light, for example, with a wavelength of maximum intensity at 485 nm minimum and/or 575 nm maximum.

The primary light source may comprise a carrier. The carrier contains a large number of control units. In particular, the carrier is a silicon-based semiconductor carrier comprising transistors and/or switching units and/or control units. The control units can be produced in CMOS technology. The carrier is preferably based on a semiconductor material such as silicon or germanium.

A semiconductor layer sequence may be attached to the carrier. The semiconductor layer sequence is adapted to generate the primary radiation. For this purpose, the semiconductor layer sequence comprises at least one active zone. The semiconductor layer sequence is preferably based on a III-V compound semiconductor material. For example, the semiconductor material is a nitride compound semiconductor material such as $AlnIn_{1-n-m}Ga_mN$ or a phosphide compound semiconductor material such as $AlnIn_{1-n-m}Ga_mP$ or also an arsenide compound semiconductor material such as $AlnIn_{1-n-m}Ga_mAs$ or such as $AlnIn_{1-n-m}Ga_mAs_kP_{1-k}$, wherein: $0 \le n \le 1$, $0 \le m \le 1$ and $n+m \le 1$ and $0 \le k < 1$. Preferably, $0 < n \le 0.8$, $0.4 \le m < 1$ and $n+m \le 0.95$ and $0 < k \le 0.5$ applies to at least one layer or to all layers of the semiconductor layer sequence. The semiconductor layer sequence may contain dopants and additional components. For the sake of simplicity, however, only the essential components of the crystal lattice of the semiconductor layer sequence are indicated, i.e., Al, As, Ga, In, N or P, even if they may be partially replaced and/or supplemented by small quantities of other substances.

In the method, the semiconductor layer sequence may be structured into a plurality of electrically independently controllable pixels in plan view. This structuring is carried out in particular by removing material from part of the semiconductor layer sequence. In other words, the semiconductor layer sequence is structured by etching. Preferably, material is removed from the semiconductor layer sequence between adjacent pixels.

The pixels may be electrically contacted independently of each other and can be controlled independently of each other. The independent control is effected via the control units in the carrier. Preferably, one of the control units of the carrier is assigned to each of the pixels and vice versa.

The method may include the step of providing one or more conversion units. At least one conversion unit is adapted to partially or completely absorb the primary light and convert it into at least one secondary light. The secondary light is generated by photoluminescence from the primary light.

The conversion unit or all conversion units may be grown contiguously from at least one semiconductor material. In particular, each conversion unit is epitaxially grown. The conversion units can be based on the same semiconductor materials as the semiconductor layer sequence of the primary light source, or on different semiconductor materials.

The conversion units that generate the secondary light may each comprise a single quantum well structure or, preferably, a multiple quantum well structure. This means that the conversion units can be composed of a sequence of several semiconductor layers. In a lateral direction, in particular parallel to a main expansion direction of the carrier, a composition of the conversion units prefers not to change or not to change significantly. In other words, the semiconductor layers of the conversion units continue over the entire respective conversion unit, preferably in an unchanged composition within the manufacturing tolerances.

The conversion units may be structured. During structuring, the semiconductor material from which the conversion units are made is removed in subareas. It is preferred to completely remove the semiconductor material in the subareas so that, seen from above, recesses and/or holes are created in the conversion units. Furthermore, it is possible that only islands of the semiconductor material of the conversion units remain, which are not interconnected by semiconductor material of the respective conversion unit.

Structuring of the at least one conversion unit may take place according to the pixels of the semiconductor layer sequence. For example, the same grid is used to structure the semiconductor material used to structure the semiconductor layer sequence into the pixels. Thus, it is possible to assign at least a part of the pixels to each area of the semiconductor material of the conversion unit so that the corresponding pixel generates the secondary light during operation.

The structured conversion unit may be applied to the semiconductor layer sequence. This results in an assignment of the remaining semiconductor material of the conversion layers after structuring to a part of the pixels. This assignment is preferably unambiguous.

The method may be established to produce optoelectronic semiconductor components and may comprise the following steps, for example, in the given order:

providing a primary light source having a carrier and a semiconductor layer sequence attached to generate primary light, wherein the semiconductor layer sequence in plan view is structured into a plurality of electrically independently controllable pixels, and the carrier comprises a plurality of driving units that control the pixels, providing at least one conversion unit adapted to convert the primary light into at least one secondary light, wherein the conversion unit is grown continuously from at least one semiconductor material, structuring the conversion unit, wherein partial regions of the semiconductor material are removed according to the pixels, and applying the conversion unit to the semiconductor layer sequence so that the remaining semiconductor material is uniquely assigned to a part of the pixels.

The primary light source may be constructed as specified in DE 10 2014 101 896 A1 or DE 10 2014 105 999 A1, the subject matter of which with regard to the primary light source is incorporated herein by reference. Such primary light sources comprising a carrier with control units and a semiconductor layer sequence structured in pixels are also referred to as microlight emitting diodes, or micro LEDs for short.

Micro LEDs are mostly monochromatic emitting components. To produce a colored image with three monochromatic micro LEDs, one for red light, one for green light and one for blue light, the emitted light by the micro LEDs can be mixed and superimposed via a prism. It is also possible to generate a color image directly from the emission of individual pixels, wherein individual different colors emitting pixels of a semiconductor material can either be placed side by side or stacked vertically on top of each other. However, such arrangements are either very time-consuming to produce due to the fact that individual pixels have to be placed individually, or have additional optical components.

With our method, on the other hand, a semiconductor component in the form of a micro LED can be efficiently produced, wherein the individual pixels result from a single semiconductor layer sequence. By applying at least one conversion unit, compact and efficiently producible pixels can be generated that emit light in different colors. This is achieved in particular by structuring the conversion units according to the division of the semiconductor layer sequence into pixels. Both the conversion units and the semiconductor layer sequence can be produced at wafer level.

By generating different colors by photoluminescence in the conversion units, it is possible to use a monochromatically emitting primary light source in the form of a micro LED. For example, the arrangement of electrical contacts and passivation layers is comparatively simple and efficient compared to other methods. The use of epitaxially grown semiconductor layers for the conversion units enables generation of a layer stack containing several layers emitting in different wavelengths. Furthermore, with such semiconductor layers for the conversion units it is possible to achieve a high degree of absorption, especially for blue light so that a local full conversion of the primary light can be achieved. In addition, spectrally narrow-band spectra of the respective photoluminescence radiation can be obtained. This opens up a wide gamut range in display applications, for example. Since at a certain location above the semiconductor layer sequence only one single conversion unit is particularly preferred, undesired absorption losses can be avoided. The use of planarization processes to fill gaps between semiconductor material areas of the conversion units enables mechanical stabilization. In addition, the conversion units can be directly bonded to the primary light source.

When structuring the semiconductor layer sequence to the pixels, there need not be a change in the position of remaining regions of the semiconductor layer sequence relative to each other. In other words, the areas for the individual pixels are not first juxtaposed by a subsequent placement process, but the pixels are created directly from the semiconductor layer sequence without subsequent rearrangement or repositioning. This also applies to the structuring of the conversion units. This means that even the remaining parts of the semiconductor material of the conversion units are not changed with regard to their position and position relative to each other after or during structuring.

Several conversion units may be applied to the semiconductor layer sequence. Exactly two conversion units are preferred. A first conversion unit converts blue light into green light, and a second conversion unit converts blue light into red light. If the primary light source emits ultraviolet radiation and little or no blue light, a third conversion unit is preferred to generate blue light.

The semiconductor layers of the conversion units may be grown on top of each other on a common growth substrate. In other words, the conversion units can form a common, coherently grown semiconductor layer sequence.

One or more of the conversion units may be structured on the common growth substrate. The structuring is, for example, photolithographically done and by etching. It is preferable to structure the conversion units one after the other in time.

In the method, only one of the conversion units need be structured on the common growth substrate. After structuring this conversion unit, the compound of the conversion units and the common growth substrate may be attached to the semiconductor layer sequence, preferably by wafer bonding. The growth substrate is then removed, for example, by laser treatment, etching and/or mechanical methods such as grinding. Finally, at least one further conversion unit is structured, wherein this structuring takes place at the semiconductor layer sequence of the primary light source.

Several conversion units may be applied to the semiconductor layer sequence of the primary light source. Each of the conversion units is grown on its own growth substrate. The conversion units thus each represent a separately produced, separate semiconductor layer sequence.

The conversion units may be structured on the respective growth substrate. This makes it possible to avoid structuring the conversion units directly on the semiconductor layer sequence.

One or more planarization layers may be applied after structuring the corresponding conversion unit. The planarization layer is made of a radiation-permeable material and preferably consists of inorganic materials, for example, an oxide such as silicon oxide or aluminium oxide or a nitride such as silicon nitride or aluminium nitride.

The planarization layer may mechanically connect individual island-like areas of the conversion units resulting from the structuring of the semiconductor material. A material for the planarization layer can be located directly on the semiconductor material of the conversion units. Alternatively, it is possible that a coating, especially an optically functionalized coating such as an optical insulation or a mirror is located between the material of the planarization layer and the semiconductor material of the conversion units.

The planarization layer may partially or completely cover a side of the conversion unit facing away from the associated growth substrate. The planarization layer can cover this side permanently or only temporarily during certain producing steps.

The conversion units may each be grown on separate growth substrates. Subsequently, the conversion units may be attached to each other before the growth substrates are detached, in particular by direct bonding with or without an intermediate layer. This creates a layer sequence from the conversion units.

The sequence of layers from the conversion units may be structured, where in particular, only one of the conversion units is structured. Subsequently, this layer sequence is attached to the semiconductor layer sequence of the primary light source. The remaining growth substrate can be removed then. The previously unstructured conversion unit can then be structured.

The conversion units may be attached to each other or the conversion units may be attached to the semiconductor layer sequence by wafer bonding. This can be wafer bonding without an intermediate layer, in particular so-called direct bonding or anodic bonding. Alternatively, a particularly oxidic or nitridic intermediate layer can be used and wafer bonding is eutectic bonding, glass bonding or adhesive bonding.

A light path between the carrier and a light exit side of the conversion units facing away from the carrier may be free of organic material. In other words, light may only pass through inorganic materials within the semiconductor component. This results in a long service life and high power densities, especially of blue light, can be achieved.

Some of the pixels may not be assigned to any of the conversion units. The primary light is emitted from these pixels without wavelength conversion. Furthermore, exactly one of the conversion units may be assigned to each of the other pixels. This means that there are no conversion units stacked on top of each other at the pixels. For example, pixels that emit the primary light without wavelength conversion are present that emit blue light. In addition, pixels may be present that emit the primary light without wavelength conversion emitting green light. For example, it is possible that blue and green light are generated by an electrically pumped stack of layers and red light is generated by an optically pumped semiconductor layer.

Several, in particular exactly three, differently colored emitting pixels may be combined to one display area. Such display areas are also referred to as colored pixels. The display areas can emit light in different colors. By arranging the pixels in display areas, it is possible to use the semiconductor component to display images or films or varying light patterns.

Adjacent pixels and/or adjacent display areas may be optically isolated from each other by a partition wall. The partition wall can be composed of one or more opaque materials. The partition may be absorbent or reflective to the radiation produced.

The partition wall may extend completely through the conversion unit. It is possible for the partition wall to be flush with the semiconductor layer sequence or partially or completely penetrate the semiconductor layer sequence. If the intermediate wall protrudes into the semiconductor layer sequence, the intermediate wall is, for example, made of an electrically insulating material or electrically insulating towards the semiconductor layer sequence. Alternatively, it is possible that, for example, an n-conducting side of the semiconductor layer sequence is electrically contacted via the partition walls so that a common electrical contact across the pixels can be realized through the partition wall.

The semiconductor layer sequence may be continuous and contiguous and preferably extends seamlessly across all pixels. Alternatively, the semiconductor layer sequence may be completely removed in areas between adjacent pixels and/or display areas so that the pixels or display areas are realized by islands out of the semiconductor layer sequence.

At least one mirror layer may be applied to one side of the conversion units facing the semiconductor layer sequence. The one or more mirror layers are impermeable or largely impermeable to the secondary light generated in the associated conversion unit. The mirror layers are preferably used to reflect this secondary light. In particular, the mirror layers are transparent to the primary light and realized by dichroic mirrors.

There may be at least one filter layer on one side of the conversion units facing away from the carrier. The filter layer is impermeable to primary light and permeable to secondary light. The filter layer can absorb or reflect the primary light. Optionally, the filter layer can be designed as an anti-reflective layer for the secondary light.

The filter layer and/or mirror layer may completely cover the associated conversion unit. Alternatively, the associated conversion unit is only partially covered by the filter layer and/or mirror layer.

At least one of the conversion units or all conversion units and/or the semiconductor layer sequence may have a thickness of at least 1 µm or 2 µm and/or a thickness of at most 15 µm or 10 µm or 6 µm. In other words, the conversion units and the semiconductor layer sequence are thin.

The pixels may have an average diameter of at least 2 µm or 3 µm or 10 µm in plan view. Alternatively or additionally, the mean diameter is at most 300 µm or 200 µm or 80 µm. In particular, these values apply not only to the mean diameter, but also to a mean edge length of the pixels if they are square or rectangular in shape in plan view.

A distance between adjacent pixels may be at least 0.3 µm or 0.5 µm or 1 µm and/or at most 10 µm or 6 µm or 3 µm. The distance between the pixels shall preferably not exceed 25% or 10% or 3% of the mean diameter of the pixels.

The finished semiconductor device may comprise at least 10 or 100 or 1000 of the pixels. Alternatively or additionally, the number of pixels shall not exceed 108 or 107 or 106 or 105. The same may apply to the number of display areas.

We also provide an optoelectronic semiconductor device. The semiconductor device is preferably produced by methods as indicated in conjunction with one or more of the above examples. Features for the methods are therefore also disclosed for the semiconductor device and vice versa.

The optoelectronic semiconductor device may comprise a primary light source comprising a carrier and a semiconductor layer sequence attached to generate primary light. The semiconductor device further comprises at least one conversion unit of at least one semiconductor material, the conversion unit being adapted to convert the primary light into at least one secondary light by photoluminescence. The semiconductor layer sequence and the conversion unit are produced separately from each other and are not grown together. Seen from above, the semiconductor layer sequence is structured into a large number of electrically independently controllable pixels. The carrier comprises a large number of control units that control the pixels and are preferably available in a 1:1 assignment to the pixels. Some of the pixels are not assigned a conversion unit so that these pixels emit the primary light and the remaining pixels are each assigned exactly one conversion unit.

Several pixels emitting different colors are combined to form a display area designed to emit light that can be adjusted in terms of color. Furthermore, a light path between the carrier and a light exit side of the conversion unit facing away from the carrier is free of organic materials.

In the following, a process described here and a semiconductor component described here are explained in more detail with reference to the drawing using examples. The same reference signs indicate the same elements in the individual figures. However, no true-to-scale relations are shown. Rather, individual elements may be exaggeratedly large for a better understanding.

FIGS. 1A-1F schematically illustrate a method of producing optoelectronic semiconductor components 1. According to FIG. 1A, a growth substrate 5 is provided. Growth substrate 5, for example, is a GaAs substrate. Two semiconductor materials 31, 41 are grown on growth substrate 5 for two conversion units 3, 4. First, a second semiconductor material 41 is grown to generate red light and then a first semiconductor material 31 to generate green light.

The two semiconductor materials 31, 41 are based on InGaAlP. The second semiconductor material 41 that generates red light is preferably based on InGaAlP. As an alternative to InGaAlP, the first semiconductor material 31 can also be based on InGaN, grown, for example, on a sapphire substrate. Such a translucent sapphire substrate can also remain attached to the semiconductor material 31, in contrast to FIGS. 1A-1F. The semiconductor materials 31, 41 each consist of several layers and preferably comprise a multiquantum well structure adapted to generate green or red secondary light by photoluminescence.

For example, a multiquantum well structure may comprise ten or more quantum well structures. For example, the multiquantum well structure in the first semiconductor material 31 may comprise twenty or more quantum well structures. Furthermore, the multiquantum well structure in the first semiconductor material 31 may comprise, for example, one hundred or fewer quantum well structures. For example, the multiquantum well structure in the second semiconductor material 41 may comprise twenty or more quantum well structures. Furthermore, the multiquantum well structure in the second semiconductor material 41 may, for example, comprise one hundred or fewer quantum well structures. According to one example, the number of quantum well structures in the first and/or second semiconductor material is between twenty and fifty quantum well structures. The number of quantum well structures in the first semiconductor material 31 and the number of quantum well structures in the second semiconductor material 41 may be different. Further, the number of quantum well structures in the first and/or second semiconductor material 31, 41 may be greater than the number of quantum well structures in the semiconductor layer sequence 22 of the primary light source 2.

The process step of FIG. 1B shows that the first semiconductor material 31 is structured. The first semiconductor material 31 is completely removed in areas, in particular by etching so that the second semiconductor material 41 is exposed in areas. Otherwise, the second semiconductor material 41 remains unaffected by this structuring.

The structuring of the first semiconductor material 31 is carried out, for example, by wet chemical or dry chemical etching. The individual, remaining island-shaped regions of the first semiconductor material 31 correspond to the size of pixels 24 of the semiconductor component 1. The island-shaped regions have, for example, an edge length of at least 3 µm and/or at most 200 µm. Seen from above, these areas are square, rectangular, round or hexagonal. These areas can be cartesian in a rectangular pattern or hexagonal. The same applies to the second semiconductor material 41 and also to all other examples.

In the process step of FIG. 1C1, a planarization layer 73 is deposited over the entire surface. The planarization layer 73 is preferably made of an electrically insulating dielectric material such as silicon dioxide. The planarization layer 73 fills gaps between the island-like, remaining regions of the first semiconductor material 31 so that a total layer with a constant thickness is formed. In addition, the planarization layer 73 firmly connects the island-shaped regions of the first semiconductor material 31 with each other. The planarization layer 73 forms together with the first semiconductor material 31 the first conversion unit 3.

According to FIG. 1C1, the planarization layer 73 has the same thickness as the first semiconductor material 31 so that the first semiconductor material 31 and the planarization layer 73 are flush with each other, directing away from the growth substrate 5. In contrast, FIG. 1C2 illustrates that a thickness of the planarization layer 73 is greater than a thickness of the first semiconductor material 31. On a side facing away from the growth substrate 5, the first semiconductor material 31 is completely covered by the planarization layer 73. The planarization layer 73 together with the first semiconductor material 31 again has a constant thickness. This thickness is at least 5 µm and/or at most 12 µm, for example, with the planarization layer 73 preferably exceeding the first semiconductor material 31 by at most 5 µm or 2 µm or 1 µm. This also applies preferentially to all other examples.

The variants with regard to the planarization layer 73, as illustrated in FIGS. 1C1 and 1C2, can also be found in all other examples. To simplify the illustration, only one of these variants is illustrated below.

FIG. 1D shows that the composite of FIG. 1C1, or alternatively FIG. 1C2, is attached to a primary light source 2. This is preferably done by direct bonding. The composite of FIG. 1C1 can directly connect to a semiconductor layer sequence 22 of the primary light source 2 as shown in FIG. 1D. Alternatively, it is possible to apply an unrepresented intermediate layer such as silicon dioxide, between the primary light source 2 and the composite of FIG. 1C1 to mediate adhesion. Alternatively, the planarization layer 73 from FIG. 1C2 can be used as an adhesion promoter.

The primary light source 2 also has a carrier 21. The carrier 21 contains a large number of control units 23. The carrier 21 is preferably based on silicon, and the control units 23 are produced in CMOS technology in the carrier 21. The semiconductor layer sequence 22 is based on AlInGaN and is designed to generate blue light. The semiconductor layer sequence 22 is divided into a number of pixels 24. Each of the pixels 24 is preferably assigned to exactly one of the control units 23 and vice versa.

Separation areas 26 are optionally located between adjacent pixels 24. Electrical and/or optical isolation of the individual pixels 24 from each other can be achieved via the separation areas 26. The semiconductor layer sequence 22 is only partially interrupted by the separation areas 26, for example, in form of unfilled or filled trenches, and extends as a continuous layer over the entire carrier 21. Seen from above, the pixels 24 are, for example, rectangular, square, round or hexagonal.

At the process step of FIG. 1E, the growth substrate 5 from FIG. 1D is removed. The growth substrate 5 is removed by grinding, polishing, wet or dry etching, laser lifting or combinations thereof.

Subsequently, in FIG. 1F, the second semiconductor material 41 is structured in the same way as the first semiconductor material 31, wherein the structuring is performed on the semiconductor layer sequence 22. The semiconductor layer sequence 22 is not affected by this structuring. A further planarization layer 73 is also applied. The further planarization layer 73 forms together with the second semiconductor material 41 the second conversion unit 4.

The island-shaped remaining areas of the two semiconductor materials 31, 41 have the same size as the areas of the semiconductor layer sequence 22 for the pixels 24. For example, a third of the pixels 24 is free of the conversion units 3, 4 in an RGB unit or a quarter of the pixels 24 is free of the conversion units 3, 4 in—an RGGB unit so that a primary light B, preferably blue light, is emitted directly from these pixels 24. Only one of the conversion units 3, 4 is assigned to each of the remaining pixels 24. First, secondary light G and second secondary light R are generated via the conversion units 3, 4, wherein green and red light are preferred. In the conversion units 3, 4, the primary light B is completely or almost completely absorbed.

Three pixels 24, emitting different colors, are combined to form a display area 6, also known as a pixel. The pixels are adapted to emit light of different colors, which is composed of the primary light B and the secondary light G, R.

In FIGS. 1A-1F, the individual display areas 6 each have exactly one area for red, green and blue light, thus forming an RGB unit. There can also be two areas for green light so that an RGGB unit with four pixels 26 is formed, or an additional unit for yellow light for an RGBY unit. It is also possible to add a fluorescent unit to produce white light, resulting in an RGBW unit. White or yellow light is generated in a not shown third conversion unit stacked above the first and second conversion units 3, 4. The display areas 6 preferably comprise each exactly three or four of the pixels 26. An ultraviolet-emitting semiconductor layer sequence can also be present as primary source 2 provided with three phosphors for red, blue and green and optionally for yellow or white, wherein the individual phosphor areas can be preferably excited independently of each other.

Since the conversion units 3, 4 do not overlap at the semiconductor layer sequence 22, the conversion units 3, 4 can be applied in any order.

Figure 1F:
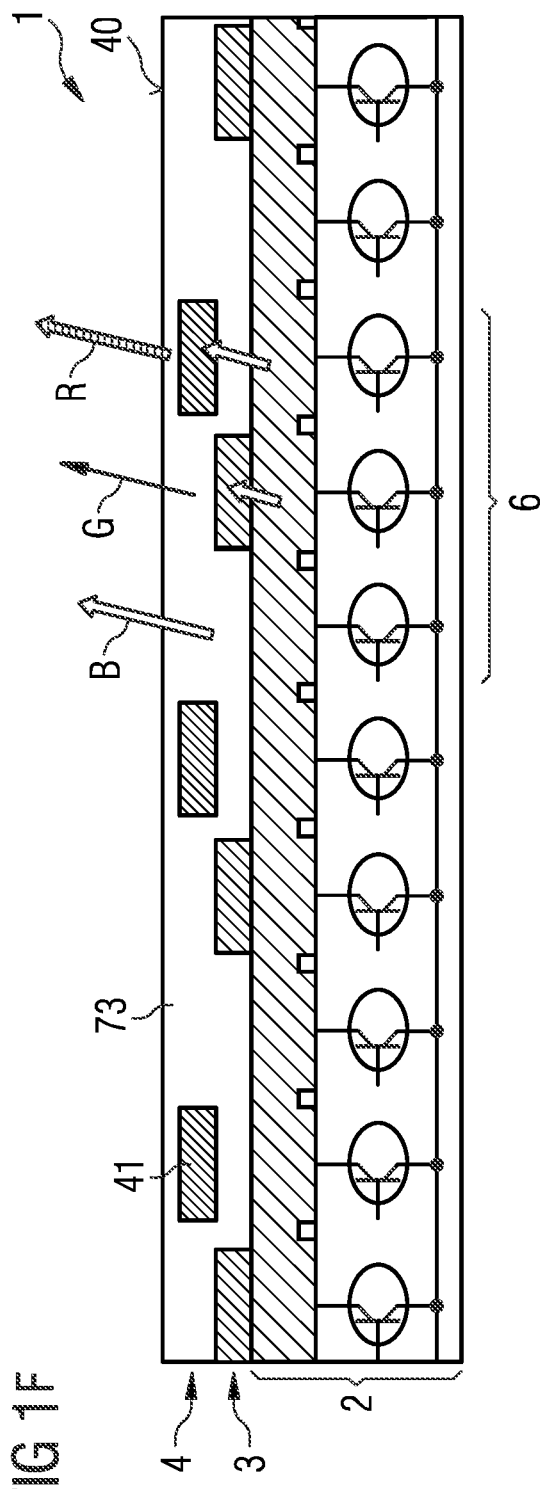

In addition to the planarization layers 73 of FIG. 1F, others not illustrated, especially transparent thin layers can also be used as additional or alternative passivation and/or encapsulation. In addition to silicon dioxide, the planarization layers 73, the optional intermediate layer and the passivation and/or encapsulation can also be made of silicon nitride, aluminum oxide, tantalum nitride, transparent oxides or nitrides of Zn, Sn, Ta, Ga, Ni, Zr, Hf, Ti or rare earth metals. The two planarization layers 73 can be made of the same material or of different materials.

To avoid a complex adjustment between the pixels 24 of the semiconductor layer sequence 22 and the structured conversion units 3, 4, emission of primary radiation from the semiconductor layer sequence 22 can be used by certain actively operated pixels 24 to locally cure or solubilize photoresists. This is, for example, done when structuring the conversion units 3, 4 directly on the semiconductor layer sequence 22 as shown in FIG. 1F.

For improved light extraction, the conversion units 3, 4 or the semiconductor layer sequence 22 can each have a roughening on a side facing away from the carrier 21. It may be possible to apply additional protective layers to such a roughening, which can be planarized optionally. Furthermore, the planarization layers 73 or at least one planarization layer 73 remote from the carrier 21 can be roughened optionally.

Figure 2A:
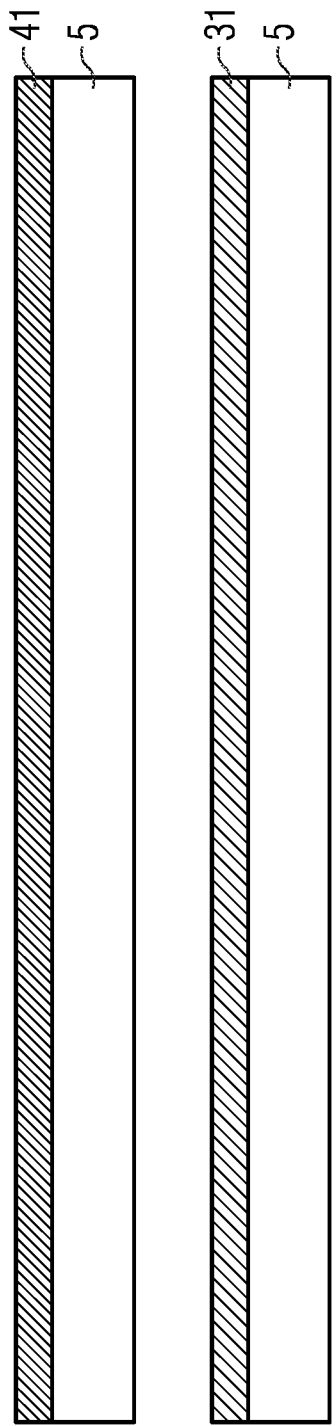
Figure 2B:
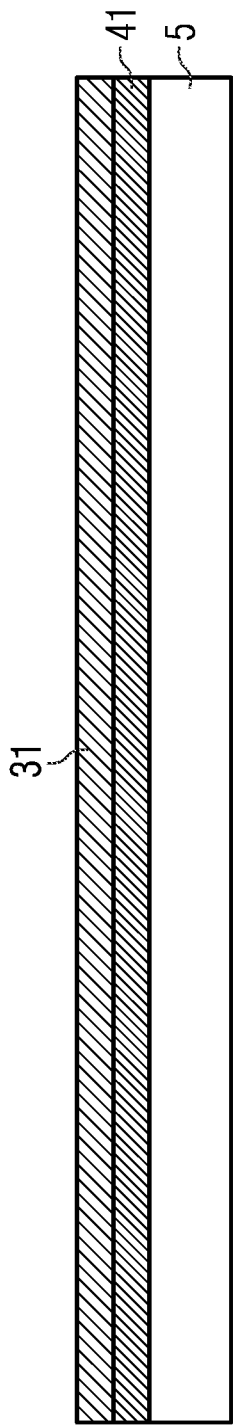

In the process of FIGS. 2A and 2B, particularly FIG. 2A, the semiconductor materials 31, 41 are grown on two different growth substrates 5. Subsequently, as shown in FIG. 2B, the semiconductor materials 31, 41 are bonded together and one of the growth substrates 5 is removed.

In the process illustrated in FIGS. 3A-3C, semiconductor materials 31, 41 are grown on separate growth substrates 5 and also structured on growth substrates 5 as shown in FIG. 3A. The planarization layers 73 are applied subsequent as shown in FIG. 3B.

Subsequently, either the two conversion units 3, 4 are first connected and then attached to the semiconductor layer sequence 22, or the conversion units 3, 4 are attached sequentially to the semiconductor layer sequence 22, as shown in FIG. 3C.

Figure 4:
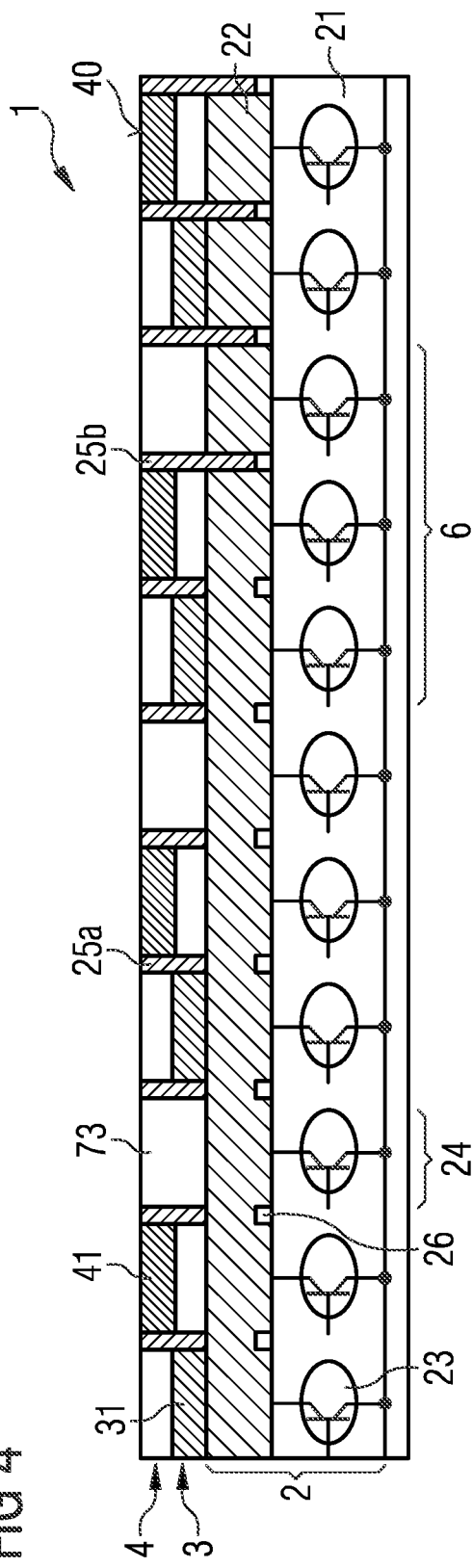

In the example of semiconductor component 1 as shown in FIG. 4, there are opaque partition walls 25a, 25b between adjacent pixels 24. Optical isolation between pixels 24, or alternatively only between adjacent display areas 6, can be achieved via these partition walls 25a, 25b and optical crosstalk is reduced or prevented. Thus, more saturated colors can be displayed and a larger gamut range can be achieved.

The partition walls 25a, 25b can be created by structuring the conversion units 3, 4, for example, by metallic or dielectric mirroring of etched flanks of the semiconductor materials 31, 32 before generating the corresponding planarization layer 73. The partition walls 25a, 25b can also be created after generating the planarization layer 73, for example, by etching trenches and subsequent filling with reflective or absorbing material.

Partition walls 25a can be limited to conversion units 3, 4. The partitions 25a do only reach the semiconductor layer sequence 22, but do not reach into the semiconductor layer sequence 22. On the other hand, in partition walls 25b generated subsequently after structuring the conversion units 3, 4, they can reach into the semiconductor layer sequence 22 and completely penetrate the semiconductor layer sequence 22, optionally together with the optionally available separating regions 26.

The partition walls 25a, 25b, for example, are made of a metal. If the partitions 25b are made of an electrically conductive material, the partitions 25b especially prefer not to reach a non-drawn metallization between the pixels 24 to avoid electrical short circuits. Alternatively, an electrical contacting of the semiconductor layer sequence 22 can be achieved via the partition walls 25a, 25b on a side facing away from the carrier 21. The partition walls 25a, 25b can also be metal spacers or optical separations generated by photo technology.

It is possible that individual pixels are structured on 24 p sides, for example, in particular on a side facing the carrier 21. For an n-contact, especially on a side facing away from the carrier 21, the semiconductor layer sequence 22 between adjacent pixels 24 can be partially removed. For better optical isolation of the pixels 24 from each other, the n-conducting GaN can be removed from the n side to this n contact then, especially before the conversion units 3, 4 are applied. All conversion units 3, 4 can also be applied first, structured and planarized, and a trench or recesses between the individual pixels 24 is only subsequent structured, especially lithographically. These trenches or recesses filled with a reflective or absorbent material can extend into the n-GaN.

Such partition walls 25a, 25b can also be present in all other examples. In the semiconductor component 1, only the partition walls 25a of the left half of the picture in FIG. 4 or only the partition walls 25b of the right half of the picture are preferred.

Figure 5:
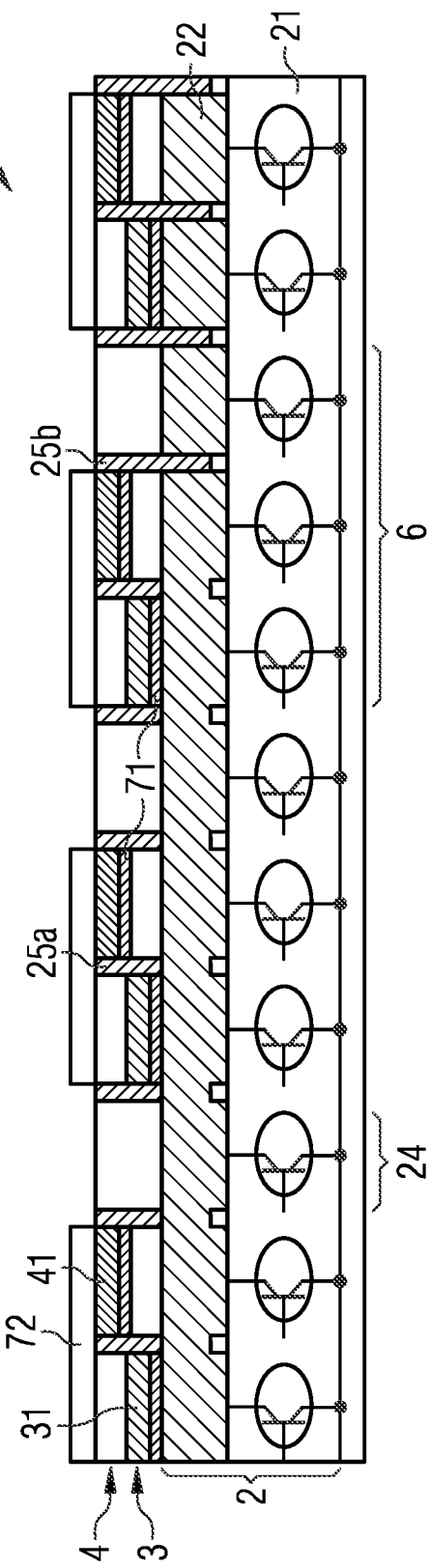

In the example of FIG. 5, additional mirror layers 71 and/or filter layers 72 are provided. The mirror layers 71, for example, dichroic and/or dielectric mirrors are each located on a side of the associated conversion unit 3, 4 facing the primary light source 2. In particular, the mirror layers 71 are directly attached to the semiconductor material 31, 41. The mirror layers 71 ensure that the secondary light generated from the primary light does not return to the semiconductor layer sequence 22. In contrast to FIG. 5, it is possible that the mirror layer 71 is generated continuously directly at the semiconductor layer sequence 22 and not at the first or second semiconductor material 31, 41.

Alternatively or in addition to the mirror layers 71, filter layers 72 are available. The filter layers 72 prevent unconverted, in particular blue primary light from exiting the individual pixels 24. The filter layer 72 can be applied continuously over several of the pixels 24 or be limited to individual pixels 24.

Figure 6:
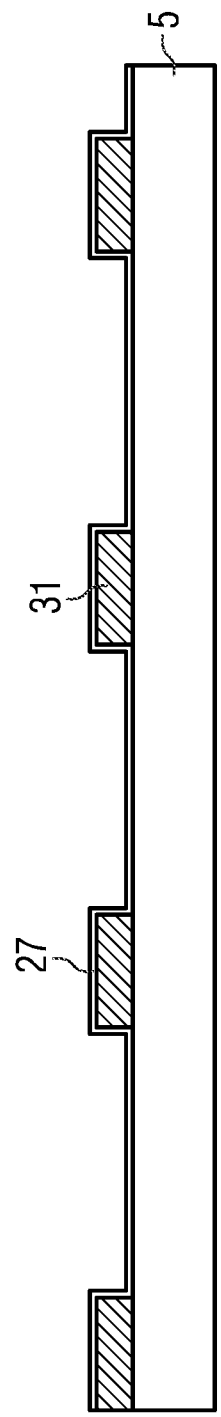
Figure 6:
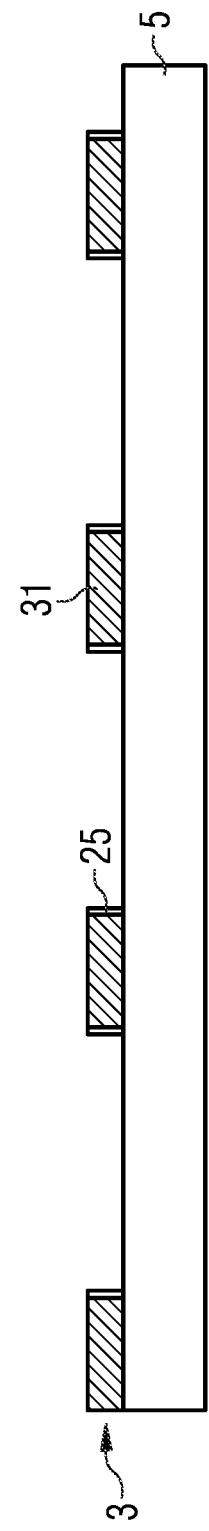

FIGS. 6A and 6B illustrate a method of producing the partition walls 25a. According to FIG. 6A, a raw material layer 27 is applied to the structured semiconductor material 31 continuously and conformally with a constant thickness. For example, the raw material layer 27 is a metal layer. The raw material layer 27 is applied, for example, by chemical vapor deposition, physical vapor deposition, atomic layer deposition or sputtering.

Subsequently as shown in FIG. 6B, an anisotropic etching such as dry etching takes place so that the raw material layer 27 remains only on the flanks of the semiconductor material 31 and thus forms the partition walls 25a.

The process steps of FIGS. 6A and 6B can, for example, be additionally performed in the process steps of FIG. 1B or 3A or 1F.

In context to FIG. 7, a further example is described in which pixels 24 are present that emit a first primary light B1 without a wavelength conversion. In addition, pixels 24 are present that emit a second primary light G2 without wavelength conversion. The first primary light B1 is blue light, the second primary light G2 is green light. Blue and green light are generated by electric pumping. There are also pixels 24 that emit secondary light R1, for example, red light. The red light is generated by the second conversion units 4.

The semiconductor layer sequence 22 has a first semiconductor layer sequence 22a that generates the second primary light G2 and a second semiconductor layer sequence 22b that generates the first primary light B1. The layer sequence directed away from the carrier 21 in the semiconductor layer sequence 22 is, for example, as follows: first semiconductor layer sequence 22a comprising a p-doped layer, for example, p-GaN, an active layer that generates green light, an n-doped layer, for example, n-GaN, tunnel contact, second semiconductor layer sequence 22b comprising a p-doped layer, for example, p-GaN, an active layer that generates blue light, an n-doped layer, for example, n-GaN.

For blue pixels 24, the p-doped layer and the active layer that generate green light of the first semiconductor layer sequence 22a are removed. The n contact connects to the upper n-doped layer of the second semiconductor layer sequence 22b.

For green pixels 24, the n contact connects to the lower n-doped layer of the first semiconductor layer sequence 22a. The not shown n contact is led out laterally.

For red pixels 24, the p-doped layer and the active layer that generate green light of the first semiconductor layer sequence 22a can be removed. The n contact connects to the upper n-doped layer of the second semiconductor layer sequence 22b. Alternatively, the p-doped layer and the active layer can remain to generate green light and can be used to excite a conversion unit 4. In this example, the n contact connects to the lower n-doped layer of the first semiconductor layer sequence 22a.

Our methods and components are not limited by the description given in the examples. Rather, this disclosure includes each new feature as well as each combination of features including in particular the combination of features in the appended claims, even if the feature or combination itself is not explicitly specified in the claims or examples.

Priority of DE 102016220915.9 is claimed, the subject matter of which is incorporated herein by reference.

The invention claimed is:

1. An optoelectronic semiconductor component comprising:
   a primary light source comprising a carrier and a semiconductor layer sequence mounted thereon and configured to generate primary light, and
   at least one conversion unit of at least one semiconductor material adapted to convert the primary light into at least one secondary light,
   wherein
   the semiconductor layer sequence and the converter unit are separate elements,
   the semiconductor layer sequence comprises a plurality of pixels,
   the pixels are configured to be controlled electrically independently of each other,
   the carrier comprises a plurality of control units configured to drive the pixels,
   all pixels of a first group are free of a conversion unit, and the pixels of the first group are configured to emit the primary light,
   all pixels of a second group of pixels comprise exactly one conversion unit each, and the pixels of the second group are configured to emit the at least one secondary light,
   a plurality of pixels from the first group and the second group are combined to form a display area that is adjustable to emit light of different colors, and
   a light path between the carrier and a light-exit side of the conversion unit facing away from the carrier is free of organic materials.

2. The optoelectronic semiconductor component according to claim 1, wherein the semiconductor layer sequence and the conversion unit are produced separately from each other and are not grown together.

3. The optoelectronic semiconductor component according to claim 1, wherein the semiconductor layer sequence and the conversion unit are in direct physical contact with each other.

4. The optoelectronic semiconductor component according to claim 1, wherein the semiconductor layer sequence is structured into the plurality of pixels that can be controlled electrically independently of each other.

5. The optoelectronic semiconductor component according to claim 1, wherein no conversion unit is assigned to the pixels of the first group so that selected pixels emit the primary light.

6. The optoelectronic semiconductor component according to claim 1, wherein the second group of pixels comprises a first sub-group of pixels configured to emit green light.

7. The optoelectronic semiconductor component according to claim 1, wherein the second group of pixels comprises a second sub-group of pixels configured to emit red light.

8. The optoelectronic semiconductor component according to claim 1, wherein the semiconductor layer sequence is based on AlInGaN, the semiconductor material is based on AlInGaN, AlInGaP or AlInGaAs, and the carrier is based on Si or Ge.

9. The optoelectronic semiconductor component according to claim 1, wherein adjacent pixels are optically isolated by an opaque partition wall from each other, the partition wall completely penetrating at least one conversion unit and at least partially the semiconductor layer sequence.

10. The optoelectronic semiconductor component according to claim 1, wherein the semiconductor layer sequence extends continuously and contiguously over all the pixels.

11. The optoelectronic semiconductor component according to claim 1, wherein at least one mirror layer is applied to a side of the conversion units facing the semiconductor layer sequence, and the mirror layer is impermeable to the secondary light produced in an associated conversion unit and permeable to the primary light.

12. The optoelectronic semiconductor component according to claim 1, wherein at least one filter layer is applied to a side of the conversion units facing away from the carrier, the filter layer is impermeable to the primary light, and the filter layer completely covers the conversion units.

13. The optoelectronic semiconductor component according to claim 1, wherein the conversion unit or each of the conversion units and/or the semiconductor layer sequence have a thickness of 1 µm to 10 µm, the pixels having an average diameter of 3 µm to 200 µm in plan view, a distance between adjacent pixels is 0.3 µm to 6 µm, and the semiconductor component includes 100 to $10^7$ of the pixels.

14. An optoelectronic semiconductor component comprising:
- a primary light source comprising a carrier and a semiconductor layer sequence mounted thereon that generate primary light, and
- at least one conversion unit of at least one semiconductor material adapted to convert the primary light into at least one secondary light, wherein
- the semiconductor layer sequence and the conversion unit are produced separately from each other and are not grown together, the semiconductor layer sequence is structured into a plurality of pixels that can be controlled electrically independently of each other,
- the carrier comprises a plurality of control units that drive the pixels,
- no conversion unit is assigned to some of the pixels so that selected pixels emit the primary light, and exactly one conversion unit each is assigned to remaining pixels,
- a plurality of pixels emitting different colors are combined to form a display area that is adjustable to emit light of different colors, and
- a light path between the carrier and a light-exit side of the conversion unit facing away from the carrier is free of organic materials.

* * * * *